Feb. 3, 1970 A. M. ADELSON ET AL 3,493,791

TWO-WIRE SOLID STATE DIRECT TOUCH RESPONSIVE SEMICONDUCTOR SWITCH CIRCUIT

Filed Aug. 12. 1966 2 Sheets-Sheet 1

INVENTORS
ALEXANDER MICHAEL ADELSON
JEROME SWARTZ

BY Rupert J. Brady
ATTORNEY

INVENTORS
ALEXANDER MICHAEL ADELSON
JEROME SWARTZ
BY Rupert J. Brady
ATTORNEY

1

3,493,791
TWO-WIRE SOLID STATE DIRECT TOUCH RESPONSIVE SEMICONDUCTOR SWITCH CIRCUIT

Alexander Michael Adelson, Elmsford, and Jerome Swartz, Elmhurst, N.Y., assignors, by mesne assignments, to Hall-Barkan Instruments, Inc., Tuckahoe, N.Y., a corporation of New York Filed Aug. 12, 1966, Ser. No. 572,092
Int. Cl. H03k *17/56*
U.S. Cl. 307—252 10 Claims

ABSTRACT OF THE DISCLOSURE

A two-wire solid state touch responsive switch circuit that includes an SCR having a gate sensitivity not exceeding 10 microamperes. An essentially resistive load is connected in series with a power source and the anode and cathode of the SCR. A capacitor and a resistor are connected in parallel between a gate of the SCR and the cathode of the SCR, the values of the capacitor and resistor being chosen to preferentially reject AC voltage on an actuating foreign body. A touch responsive element is connected through a resistor to the SCR gate so that when touched by the foreign body the ambient AC voltage on the body picked up from ambient AC sources fires the SCR.

This invention relates to electronic switches and more particularly to a two-wire solid state switch circuit which is actuated to the active state to close a load circuit in response to the touch of a human body or its electrical equivalent.

In the past, touch responsive switches have depended upon the internal power supply for their switching action signal drive. It is an object of the present invention to remove the individual from the feedback-voltage divider loop, commonly used in prior art devices, so that triggering depends only upon an externally available ambient drive essentially entirely independent of the internal power supply voltage, frequencies, regulation, etc.

Moreover, it is an object of the invention to provide a construction of touch responsive switch having relatively few components, which is simple and compact in construction, economical to manufacture and compatible with mass production techniques. The switch of the present invention utilizes a highly current sensitive semiconductor element, such as a semiconductor controlled rectifier, as a switching element which is responsively triggered into a state of conduction upon contact by the finger of a human operator, or some other electrically equivalent external operator, through an antenna element connected in the four-layer device trigger circuit. The basic mode of touch operation of the switch depends essentially upon the capacitively-coupled voltage pick-up of the human body, 60 cycles typical, for the touch responsive triggering operation.

Another object of the present invention is to provide a construction of electronic switch which has no moving parts, and indefinitely long operating lifetime as established by well beyond 20,000,000 firings or cycling operations of the switch of the invention with no appreciable change in reliability or performance; additionally, the switch eliminates contact bounce, contact sticking, and burning and wear associated with conventional mechanical and electro-mechanical switches.

A further object of the invention is to provide a construction of touch responsive solid state switch which is fast in switching between states, in the microsecond range, is isolated from the control signal, and produces essentially no external transient effects during typical cycling operations.

2

Still another object of the invention is to provide a simply constructed compact semiconductor switch which can be operated as an AC momentary switch or a DC latching switch, for utilization whenever a simple switching action is required, and to drive more sophisticated and/or higher power switching circuits.

Still a further object of the invention is to provide a touch responsive switch having a high ratio of OFF-ON resistance, approximately $10^8$:1, with essentially no current drain in the OFF state, and with only a slight voltage drop or power dissipation in the ON state.

Other and further objects of the invention reside in the manner in which the human operator, or mechanical foreign body, is utilized in an antenna circuit portion of the semi-conductor switch to trigger the switch into producing a momentary switching action or a latching switching action. Other objects reside in the switch characteristics of distortionless wave-form transmission, essentially unlimited innate frequency response (band width limited by power source only), and the avoidance of load sensitivity as a prime factor of switch operation. Other and additional objects of the invention are set forth more fully in the specification hereinafter following by reference to the accompanying drawings, in which:

Figure 1:
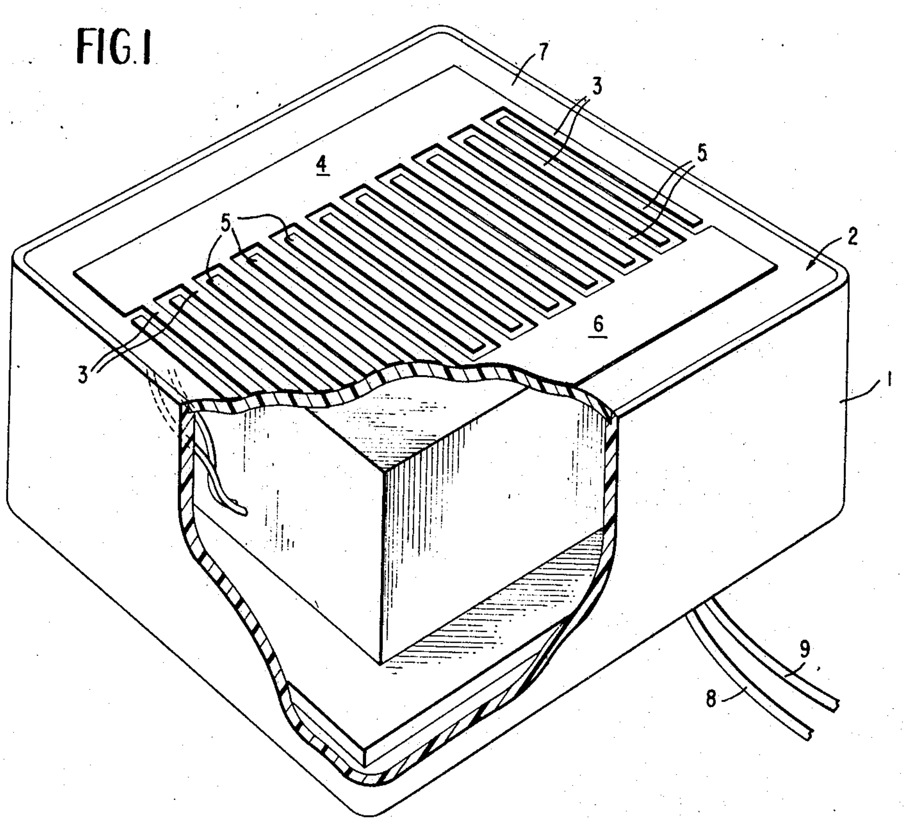
FIG. 1 is a perspective view of the switch of the invention and particularly showing a preferred arrangement of the touch contact antenna.

Referring to the drawings in greater detail, a perspective view of the novel switch is shown in FIG. 1, which consists of a body portion or housing 1 of electrical insulation material, such as plastic or the like, having an electrically conductive element or antenna 2 forming the front surface of the housing. Under certain conditions, antenna 2 which forms the touch activation surface for the switch may be a solid sheet of electrically conductive material such as stainless steel, but an alternate construction of the antenna element 2 is shown in FIG. 1. as consisting of a plurality of electrically conductive parallel finger-like elements 3, commonly connected by conductor 4 at one end, intermeshed in spaced relation with another set of electrically conductive parallel finger-like elements 5 commonly connected by conductor 6. Elements 3, 4, 5 and 6 are connected on a base portion 7 of electrical insulation material and the entire antenna element 2 may be formed from a printed circuit board. If the base portion 7 is constructed of translucent or transparent material, a lamp (not shown) may be located behind the base portion, interior of housing, 1 along with the other circuit elements, to illuminate antenna element 2 from behind upon actuation of the switch.

Figure 2:
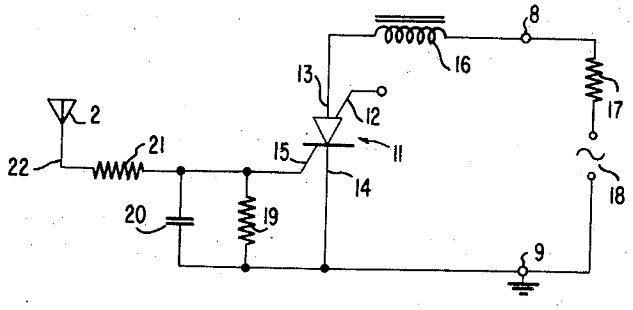
FIG. 2 is an electrical schematic of the touch activated AC momentary switch of the invention.

The circuit components of the switch within housing 1 may be mounted on a printed circuit board with the circuit terminating in a pair of electrical terminals 8 and 9 protruding from the back of housing 1 for connecting the switch into an external electrical circuit. The electrical circuit of the four-layer semiconductor touch switch of the invention, which is a half-wave AC momentary action switch is shown in FIG. 2. This switch is operated as a momentary action switch by supplying the anode with an AC voltage source. Voltage pick-up by the human body or other external object touching the antenna element 2 provides the drive to fire the semiconductor device and this yields inherently half-wave rectified outputs. The actual momentary aspect is accomplished by providing any anode excitation which approaches 0. The loop voltage and current levels drop below the respective maintaining voltage and holding current limits every half cycle, turning OFF or commutating the switch; consequently the switch stays ON only as long as drive is supplied to refire it every positive half-cycle.

It is understood that the main switch element components are housed in body portion or housing 1, with the electrically conductive antenna element 2 forming the front surface of the housing. It can be appreciated by one skilled in the art that the switch structure is extremely simple and compact in construction as well as aesthetic in appearance, and can be easily mounted in a variety of ways on panels and the like. The switch unit approaches a hermetically sealed condition, has no moving parts, and can withstand extremes in shocks and vibrations in the region of 30 to 50 G continuously without effecting switch operation or efficiency. The switch units are also basically explosion-proof and electrically safe, as terminal voltages are never exposed to the local environment. The touch operated solid state switches disclosed are strictly two wire devices, a prime design objective and technical constraint, which require no external power other than the power with which the switch is placed in series and is thus expected to control such a switch, i.e., a "two-wire" switch, is the electronic equivalent of a mechanical single-throw, single-pole switch, which is to say, an electronic switch whose only connection in a load circuit is its interposition in a break in the circuit; it needs no wired source of activating potential for operating the switch.

The main component 11 of the electrical circuit is a solid state device of the pnpn four-layer semiconductor controlled rectifier class, readily available on the commercial market from several manufacturers of solid state components under any one of the following trade names: Silicon Controlled Rectifier (SCR); Silicon Controlled Switch (SCS); Gate Turn-Off Switch; Transwitch; Trinistor; Binistor; Trigistor, or Thyristor. Any of these devices may be utilized in the switch of the invention as long as it has the characteristic of sufficiently high sensitivity (current and/or voltage) associated with the cathode gate, and the impedances of the input circuits are high.

In FIG. 2 a four-terminal or four-layer low-powered Silicon Controlled Rectifier (SCR) has been illustrated for purposes of explanation, although such illustration is not necessary since a fourth layer or anode gate terminal 12 is not utilized. Experience has shown that a 3N84 controlled rectifier operates extremely well in the circuit of the invention because of its extremely sensitive cathode gate characteristics, and also is desirable because of its relatively low cost. This particular controlled rectifier 11 is a four-layer solid state device and this is the reason behind illustrating the fourth terminal 12, even though it is not necessarily utilized, except for producing negative going half-wave rectified momentary switch outputs, since it is not essential to the switching operation as used in the present circuit. SCR 11 includes an anode 13, cathode 14, cathode gate electrode 15, and the previously-mentioned anode gate electrode 12.

Anode 13 is connected to one end of an RF choke 16, which in turn is connected at the opposite end through electrical terminal 8 to one end of an essentially resistive load 17. Load 17, which represents the device controlled by the switch, is connected at its opposite end in series circuit with a source of AC power 18, such as 60 volts or less, and 200 milliamps or less, and the opposite side of AC source 18 is connected through electrical terminal 9 to cathode 14 of SCR 11. The AC source 18, load 17, choke 16 and the anode 13 and cathode 14 of the SCR 11 are thus connected in a series circuit.

The small series inductance or choke 16, usually having a value in the range of 2 millihenries (mh.) to 20 mh., serves to block transients with the slight concurrent side effect of hold-on or anti-commutation enhancement, but for the load ranges of practical interest, intolerably large inductances are required to get any sort of time constant capability, so that the inductance alone cannot be relied upon to accomplish zero crossover or switch hold-on and resultant full-wave operation. At high frequencies, or rapid rates of change, a reasonable value of inductance 16 of approximately 10 mh. will retard excessive currents from burning out the SCR 11 which it protects. The main function, therefore, of the choke or inductance 16 is to provide reliable operation of the four-layer semiconductive touch switch in noisy surroundings where there are many stray radiations and transients in the atmosphere or series power line itself under ambient conditions, such as would be encountered in the vicinity of large machinery, certain electronic consoles, etc. The small time constant the inductance does introduce into the SCR circuit reduces the effect of line noises, spurious pulses and other sources of undesired large amplitude noises which might tend to falsely actuate the switch if the inductance was not inserted in the circuit.

In the OFF state, full voltage appears across SCR or SCS 11 and a no load condition prevails. Touch activation surface or antenna 2 is connected through resistor 21 to cathode gate 15. Resistor 21 is in the megohm range mainly for use as a safety device to isolate the human or passive actuator and to prevent damage to the SCR from accidental shortcircuiting to a floating potential. A parallel RC "Suppression" network, comprising a resistor 19 and a capacitor 20 connected in parallel, is connected between cathode gate 15 and cathode 14, to form a resistor-capacitor negative gate bias circuit and cathode gate filter. The purpose of resistor 19, and at high frequencies capacitor 20, in the RC network, is to provide a divisionary path for negative gate current around the cathode gate-to-cathode junction (diode). This circuit consequently reduces the forward bias on this junction (due to temperature, anode voltage, or $dv/dt$ of anode voltage effects), increasing circuit stability by effectively raising the forward breakover voltage and $dv_a dt$ (rate effect)=withstand capability. A reduced sensitivity accrues, with respect to both signal and noise, since any antenna trigger current must also supply shunt current to this bias impedance. If the RC circuit 19, 20 was not present spurious switching action of controlled rectifier 11 could be generated from such sources as RF radiation in the atmosphere, RF radiation from machinery in the vicinity, line noises, and various other local oscillations, all of which are classified under ambient radiation.

The antenna contact button 2, which conductively feeds bias circuit 19, 20 and cathode gate 15 can be extended in cross sectional area with no accompanying degradation of performances.

Experience has shown that the human body is most often modulated by 60 cycle pick-up. The main object of the present invention is to provide a solid state switch structure which operates merely upon contact with the human body independent of internal power settings and requirements. The practically omnipresent voltage pick-up by what is the essentially equivalent capacitance of the human body (i.e.—$C_b \sim 2\pi E_0$ [height]$\sim$100 picofarads) serving as an antenna receiver or applicator, can be utilized to trigger a sufficiently current and/or voltage sensitive SCR, SCS 11, or the like. The switch is tailored to the single gate drive wave-form, that is, mainly to a 60 cycle pick-up signal applied to the SCR cathode gate, or anode gate 12 (which circuit is not shown but operates the same), and half-wave rectified by the cathode gate to cathode equivalent diode or anode gate to anode equivalent diode respectively, so that the output is either positive or negative going half-wave rectified, respectively. For example, even though full wave AC bridge power may supply the touch activation element 11, its cathode load will be high only when the signal is high (i.e. positive halfwave output), unless auxiliary means are provided to hold ON the switch by maintaining holding current at 0 crossover.

If the touch activation semiconductor breakdown rating is $V_b$(DC) then we can show that $E_{rms}$ has only to be less than $$\frac{\pi}{2}\sqrt{2}$$

(about 2¼) times as much as $V_b$(DC) to prevent anode breakdown, due to an integrated or average power requirement. A body, or the like, contacting antenna 2, develops on the order of microamps of AC current in the trigger circuit which causes the SCR 11 to fire or turn ON and once firing is initiated the SCR looks like a forward biased diode which drops less than 1 volt, leaving nearly full supply voltage and current 18 (200 ma.) to power the load 17. The next or succeeding negative swing of the AC source current 18 turns the SCR and the switch OFF, thus giving the switch its momentary action. The SCR stays ON as long as a drive current is supplied through antenna 2 by the operator's finger to gate 15, or gate 12 as the case may be, to refire the SCR every positive half-cycle. The SCR thus stays ON until the finger is removed from antenna 2 and then the succeeding negative swing of the source current turns the SCR OFF.

The RC 19, 20 combination has been empirically optimized, selection having been based upon stability against spurious triggering effects and enhancement of proper and reliable touch switch operation by the human body, or similar foreign body. The optimum value of resistor 19 is 330K ohms and the optimum value of capacitor 20 is .01 microfarad. A typical SCR which functions well in the practice of the invention is a 3N84. The values of 19 and 20 are so selected as to provide a low-pass filter, i.e., to present a poor by-pass to the potential present on a human body by virtue of the ambient ubiquitous power supply, and a good by-pass to substantially higher frequencies such as are generated by spurious electric noises and static. The gate sensitivity of a 3N84 SCR or of an AA1041–HB02 sold by Solid State Products, Inc. hereinafter referred to, does not exceed 10 microamperes, a factor which enables the SCR to be fired in the aforesaid manner, so that when a human operator touches antenna 2 he produces a trigger current, in conjunction with the RC network on cathode gate electrode 15, which exceeds the SCR bias and causes SCR 11 to conduct, thus closing the AC switch circuit and causing current flow from the AC source 18, through load 17, choke 16 and the SCR 11, back to the source. Changes in the capacitance of the human body, or in the lumped equivalent impedance looking into the human finger, such as caused by humidity, atmospheric conditions, distance of the body from ground, etc., which normally affect the operation of a voltage division operated switch, does not essentially affect the operation of the switch of the present invention and requires no adjustment or modification of internal circuitry.

Figure 3:
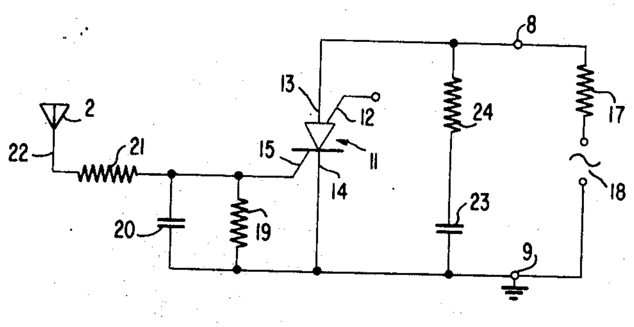
FIG. 3 is a modified form of the switch of FIG. 2.

A modified form of the circuit of FIG. 2 is shown in FIG. 3, wherein the circuit is identical but with the addition of a shunt circuit connected across anode 13 and cathode 14, comprising a capacitor 23 connected in series with a resistor 24, which resistor has a value of approximately twice the anode or cathode resistive load 17. This shunt circuit across SCR 11 forms an appropriate current (i.e. 2RL) and time constant (i.e. C) limiter circuit for transient voltage effect suppression by effectively bypassing the solid state device 11.

Figure 4:
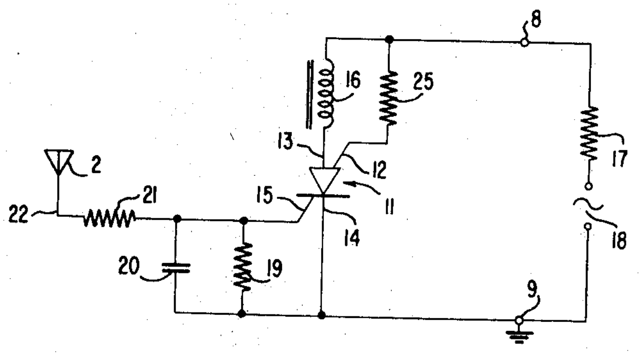
FIG. 4 is another modified form of the switch of FIG. 1.

A further modified form of the switch circuit of FIG. 2 is shown in FIG. 4 wherein, if due to noise sources and the like, it is necessary to further limit rate effect (i.e. *dv/dt* withstand) by raising the withstand capability, the heretofore unused anode gate electrode 12 of SCR 11 is returned to the anode supply, that is, terminal 8, through a current limiting resistor 25. In this form of the circuit, one end of resistor 25 and one end of choke 16 are commonly connected with terminal 8. Current limiting resistor 25 has been found most effective when it has a value of approximately 220K ohms. The addition of this resistor in the anode gate circuit is an auxiliary means of obtaining circuit stability under difficult ambient conditions.

The parallel RC suppression circuit 19, 20, the series resistor 24 and capacitor 23 bypass circuit of FIG. 3, the series choke 16 of FIGS. 2 and 4, and the anode gate current limiting resistor 25 suppression circuit of FIG. 4, all serve to greatly attenuate, if not entirely eliminate, spurious switching action generated by RF ambient radiation from machinery or the atmosphere, line transients, local oscillator pick-up, and other noise sources as previously mentioned. It is to be understood that all of these various suppression circuits and techniques can be combined in a single circuit where necessary, and with the exception of suppression circuit 19, 20 are not absolutely necessary to circuit operation if ambient conditions are favorable.

The touch activated switch of the invention may also be fired by contact with other foreign bodies other than the human body. For instance, the switch circuit can be tuned to detect ½ megacycles by bringing a conductor (not shown) designed to receive such a wave length into contacting relation with the surface of the cathode gate electrode receiving antenna 7. The conductor would act as a high gain antenna detecting radiation from some local oscillator to supply cathode gate switching current and fire the controlled rectifier in the same manner as with a human operator. The switch triggering can also be made readily amenable to implementation by any contact or radiative ambient signal purposefully created in the operating environment.

Figure 5:
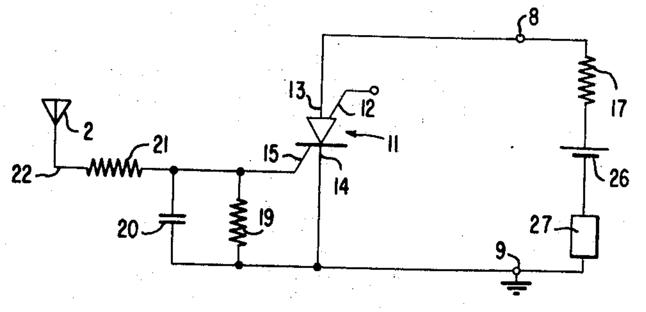
FIG. 5 is an electrical schematic of a DC version of the switch of FIG. 1.

The switching circuit of the invention connected for operation with a DC supply voltage source 26 is shown in FIG. 5. In this mode of operation, the circuit performs as a low power latching switch. The voltage range of the circuit is limited only by the requirement that E of source 26 must be less than the DC breakdown voltage $V_b$ of SCR 11, which may vary from 40 volts for the 3N84 SCS to 60 volts for the Solid State Products, Inc. AA1041-HB02 four-layer SCR, which can be used, for example, as element 11, through hundreds of volts for more expensive semiconductor controlled rectifiers.

When trigger power is applied to cathode gate 15 by the human operator through antenna 2, conductor 22, and resistance 21, the normally OFF four-layer semiconductor 11 becomes forward biased to the ON condition and this ON condition is steadily maintained by the DC supply voltage 26. Operation is otherwise essentially identical to the AC momentary switch of FIG. 2 and all the auxiliary stability and suppression features of FIGS. 2–4 carry over and are also applicable to the circuit of FIG. 6, to be explained. An external mechanical or electronic means 27 must be utilized to turn OFF this switching circuit to return the four-layer semiconductor 11 to the OFF state. In the simplest form means 27 for performing this function can consist of another switch of any type.

Figure 6:
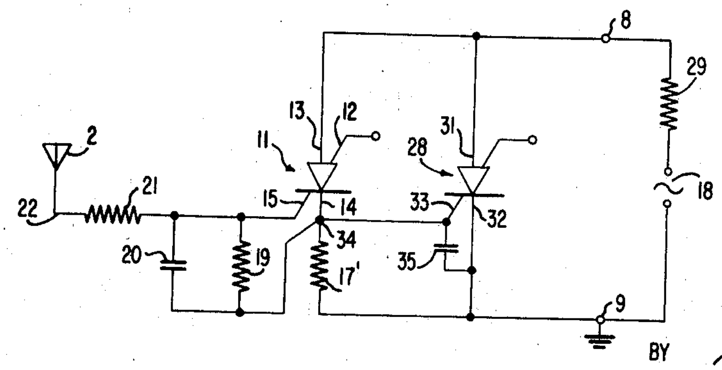
FIG. 6 is a further modified form of the circuit of the invention for increasing the power-handling capability of the touch actuated switch.

As indicated in FIG. 6, to increase the power-handling capability of the switch circuit of the invention, a low power four-layer semiconductor or SCR 11 must first be driven by a touch activation from an external body on antenna 2 to control a higher power semiconductor controlled rectifier 28, such as an SCR or the like, as previously mentioned, since the high power-handling capability of relatively low cost semiconductor switching devices 28 are to date of insufficient sensitivity to be driven directly by the minute current pick-up of the human body, although more expensive high power handling switching devices having the necessary sensitivity are available. Therefore, to attain half-wave momentary switch operation over a higher power range at reasonable costs, a conventional power-handling SCR 28 is connected in tandem with SCR 11 of the basic AC momentary switching circuit shown in FIG. 2. In this form of the invention the essentially resistive load 29 is connected in series circuit with the AC power source 18, and the cascaded SCR's 11 and 28. The cathode gate 33 is connected to the cathode 14 of SCR 11 at junction 34 and a cathode load resistor 17' is connected between junction 34 and ground. Cathode load resistor 17' is comparable to the load previously indicated at 17 and it is to be understood that the previous load 17 in FIGS. 2–5 can be connected in the cathode circuit rather than the anode circuit, as shown. A charging capacitor 35 is connected between gate terminal 33 and ground.

When the power SCR 28 is OFF its cathode gate 33 is at a high resistance. When SCR 11 is triggered to the ON state in response to a touch activation of antenna 2 by the human body the voltage across resistor 17' appears across cathode gate electrode 33 of the power SCR causing capacitor 35 to charge and power SCR 28 to switch to the ON state to energize load 29 with the power source 18. The gate impedance of SCR 28 becomes very low when it turns ON and the charge on capacitor 35 continues to drive gate 33 to sustain SCR ON for a longer period, that is for at least half-wave duration. The succeeding negative half cycle of AC source 18 turns SCR 28 and SCR 11 to the OFF state, after the operator's finger is removed from element 2. Thus, a half-wave momentary switch operation is obtained in a higher power range, at a reasonable cost. When power source 18 is a full-wave rectified source or a D.C. source as shown at 26 in the circuit of FIG. 5, this circuit then functions as a latching circuit similar to the operation described in connection with FIG. 5, and when SCR's 11 and 28 are switched to the ON state through the touch of the operator's finger, they remain latched on in the ON state until the circuit to the power source is interrupted. When the source is full rectified AC power then capacitor 35 must be sufficiently large such that its charge holds on SCR 28 past the zero voltage point of the AC power.

If the size of the capacitor 35 is increased we can obtain three-quarter wave momentary operation of the circuit, but there is a practical limit, for if the capacitance is made too large SCR 28 will remain in the ON state, all control being lost.

While the invention has been shown and described in certain preferred embodiments, it is realized that modifications can be made without departing from the spirit of the invention, and it is to be understood that no limitations upon the invention are intended other than those imposed by the scope of the appended claims.

What we claim as new and desire to secure by Letters Patent of the United States, is as follows:

1. A two-wire, solid state, touch responsive switch circuit comprising: semiconductor means having at least an anode electrode, a cathode electrode and a gate control terminal, said semiconductor having a gate sensitivity not exceeding 10 microamperes; a power source; an essentially resistive load having terminals connected in series circuit with said anode electrode, said cathode electrode and said power source; a capacitor and a resistor connected in electrical parallel forming a gate bias circuit connected at one end to said gate control terminal and at the other end to a bias source; the values of said capacitor and said resistor being chosen to preferentially reject the AC voltage present on a foreign body from an AC ambient source; and an electrically conductive touch response element disposed in spaced relation with said semiconductor means and said gate bias circuit; circuit means including a resistance connected between said electrically conductive touch response element and said gate terminal; said electrically conductive touch response element being responsive to the contact of a foreign body bearing a voltage from an AC ambient source to cause said semiconductor means to switch to the conductive state and energize said load.

2. A touch responsive switch circuit, as set forth in claim 1 in which said semiconductor means is a pnpn controlled rectifier.

3. A touch responsive switch circuit as set forth in claim 1, including a second resistance and a second capacitor connected in a series circuit, and said series circuit connected across said anode electrode and said cathode electrode.

4. A touch responsive switch, as set forth in claim 1, in which the value of said resistor is approximately 330K ohms and the value of said capacitor is approximately .01 microfarad.

5. A circuit as set forth in claim 1 in which said power source is an AC power source, and said gate control terminal is a cathode gate terminal and said semiconductor rectifier means produces positive half-wave rectified current across said load.

6. A circuit as set forth in claim 1 in which said source is an AC power source, and said gate control terminal is an anode gate terminal and said semiconductor rectifier means produces negative half-wave rectified current across said load.

7. A touch activated switch as set forth in claim 1 in which said power source is an AC power source, and said semiconductor means is connected to be returned to the nonconductive state on the succeeding cycle of said AC source, after removal of said foreign body from said touch response element to produce half-wave momentary switching action.

8. A touch activated switch as set forth in claim 1 in which said power source is a DC power source, and said semiconductor means is connected to remain in the conducting state due to said DC source after removal of said foreign body from said touch response element to produce latching action.

9. A circuit as set forth in claim 7 in which said power source is an AC power source, said circuit including second controlled semiconductor rectifier means including at least an anode electrode, a cathode electrode and a gate trigger terminal; said trigger terminal connected to said cathode electrode of said first-mentioned controlled semiconductor rectifier means; a second capacitor connected between the trigger terminal and cathode electrode of said second controlled semiconductor rectifier means and constituting a charge device means of sufficient capacity to maintain the second controlled semiconductor rectifier means in a conductive state to form a latching switch device; said anode electrode of said second controlled semiconductor rectifier means connected to the anode electrode of the first-named semiconductor means; and said cathode electrode of said second controlled semiconductor rectifier means connected to the side of said resistive load opposite the end connected to said cathode electrode of said first-mentioned semiconductor means, whereby said second controlled semiconductor rectifier means is switched to the conducting state when said first-mentioned semiconductor means is conductive to energize said load, and said first-mentioned semiconductor means and said second controlled semiconductor rectifier means connected to be switched to the nonconductive state by the succeeding cycle of said AC power source.

10. A circuit as set forth in claim 7 in which said power source is an AC power source, said circuit including a second controlled rectifier means having an anode electrode, a cathode electrode and a cathode gate terminal; said cathode gate terminal connected to said cathode electrode of said first-mentioned semiconductor means to switch said second controlled rectifier means to the conducting state when said first-mentioned semiconductor means is conducting; charging means connected between said gate control terminal and said cathode electrode of said second controlled rectifier means; said anode electrode of said second controlled rectifier means connected to said anode electrode of said semiconductor means; and said AC source connected to return said first-mentioned semiconductor means and said second controlled rectifier means to the non-conductive state on a succeeding negative half-cycle thereof after removal of the foreign body from said touch response element.

References Cited

UNITED STATES PATENTS

| | | | |
|---|---|---|---|
| 3,303,397 | 2/1967 | Myers | 328—5 X |
| 3,243,602 | 3/1966 | Storm | 307—252 |
| 3,286,250 | 11/1966 | Teitelbaum | 307—284 X |
| 3,365,642 | 2/1968 | Risberg | 307—252 X |

OTHER REFERENCES

General Electric Silicon Controlled Rectifier Manual, 1964, pp. 121, 122, 99, 100 and 264.

R. A. Stasior, Silicon Controlled Switches, 1964, fig. 20.

JOHN S. HEYMAN, Primary Examiner

J. D. FREW, Assistant Examiner

U.S. Cl. X.R.

307—305, 308; 317—123; 328—5; 340—258